(12) United States Patent
Zhang (10) Patent No.: US 6,907,090 B2
(45) Date of Patent: Jun. 14, 2005

(54) METHOD AND APPARATUS TO RECOVER DATA FROM PULSES

(75) Inventor: Guo Ping Zhang, Singapore (SG)

(73) Assignee: The National University of Singapore, Singapore (SG)

( * ) Notice: Subject to any disclaimer, the term of this patent is extended or adjusted under 35 U.S.C. 154(b) by 692 days.

(21) Appl. No.: 09/805,854

(22) Filed: Mar. 13, 2001

(65) Prior Publication Data

US 2002/0131530 A1 Sep. 19, 2002

(51) Int. Cl.[7] .................................................. H03D 1/00
(52) U.S. Cl. .................. 375/340; 375/360; 340/825.57; 370/301; 342/51; 341/133; 708/819; 714/823
(58) Field of Search .............................. 375/340, 360; 340/825.57; 370/301; 342/51; 708/819; 341/133; 714/823; 704/222

(56) References Cited

U.S. PATENT DOCUMENTS

| | | | |
|---|---|---|---|
| 3,129,342 A | 4/1964 | Kaenel | |
| 3,209,282 A | 9/1965 | Schnitzler | |
| 3,239,832 A | 3/1966 | Renard | |
| 3,246,256 A | 4/1966 | Sommers, Jr. | |
| 3,303,350 A | 2/1967 | Neff et al. | |
| 3,312,911 A | 4/1967 | De Boer | |
| 3,387,298 A | 6/1968 | Kruy | |
| 3,527,949 A | 9/1970 | Huth | |
| 3,571,753 A | 3/1971 | Saunders | |
| 3,755,696 A | 8/1973 | Nicholson et al. | |
| 3,761,621 A | * 9/1973 | Vollmeyer et al. | ........... 370/301 |
| 3,846,717 A | 11/1974 | Fleming | |
| 3,967,210 A | 6/1976 | Aumann | |
| 4,028,562 A | 6/1977 | Zuleeg | |
| 4,037,252 A | 7/1977 | Jansen | |
| 4,169,264 A | * 9/1979 | Parker | ........................ 342/51 |
| 4,365,212 A | 12/1982 | Gentile et al. | |
| 4,425,647 A | * 1/1984 | Collins et al. | .............. 714/823 |
| 4,459,591 A | * 7/1984 | Haubner et al. | ....... 340/825.57 |
| 4,560,949 A | 12/1985 | Young | |
| 4,599,549 A | 7/1986 | Mutoh et al. | |
| 4,641,317 A | 2/1987 | Fullerton | |
| 4,743,906 A | 5/1988 | Fullerton | |
| 4,862,160 A | 8/1989 | Ekchian et al. | |

(Continued)

FOREIGN PATENT DOCUMENTS

| | | |
|---|---|---|
| DD | 94 855 | 1/1973 |
| DE | DT 2459531 A1 | 7/1976 |

(Continued)

OTHER PUBLICATIONS

Patarasen, S. et al., Maximum–Likelihood Symbol Synchronization and Detection of OPPM Sequeunces, IEEE Transactions on Communications, New York, US, Jun. 1994, pps. 9, vol. 42, No. 6.

(Continued)

Primary Examiner—Stephen Chin
Assistant Examiner—Sudhanshu C. Pathak
(74) Attorney, Agent, or Firm—Townsend and Townsend and Crew LLP; Kenneth R. Allen (57) ABSTRACT

Methods and corresponding apparatus to recover data from a signal comprising groups of pulses generated in response to analog waveforms are described. Data recovery in accordance with the invention is based on parameters characterizing the groups of pulses. These parameters are the basis for mapping the groups of pulses to information symbols which collectively constitute the data to be recovered.

5 Claims, 10 Drawing Sheets

U.S. PATENT DOCUMENTS

| | | | |
|---|---|---|---|
| 5,012,244 A | 4/1991 | Wellard et al. | |
| 5,107,264 A | 4/1992 | Novof | |
| 5,170,274 A | 12/1992 | Kuwata et al. | |
| 5,274,375 A | 12/1993 | Thompson | |
| 5,337,054 A | 8/1994 | Ross et al. | |
| 5,339,053 A | 8/1994 | Lux et al. | |
| 5,459,749 A | 10/1995 | Park | |
| 5,461,643 A | 10/1995 | La Rosa et al. | |
| 5,532,641 A | 7/1996 | Balasubramanian et al. | |
| 5,539,761 A | 7/1996 | Golub et al. | |
| 5,610,907 A | 3/1997 | Barrett | |
| 5,640,427 A | 6/1997 | Ranish | |
| 5,691,723 A | 11/1997 | King et al. | |
| 5,757,301 A | 5/1998 | Kuo et al. | |
| 5,764,702 A | 6/1998 | Caiaffa | |
| 5,777,507 A | 7/1998 | Kaminishi et al. | |
| 5,789,992 A | 8/1998 | Moon | |
| 5,812,081 A | 9/1998 | Fullerton | |
| 5,832,035 A | 11/1998 | Fullerton | |
| 5,892,701 A * | 4/1999 | Huang et al. | 708/819 |
| 5,901,172 A | 5/1999 | Fontana et al. | |
| 6,023,672 A * | 2/2000 | Ozawa | 704/222 |
| 6,044,113 A | 3/2000 | Oltean | |
| 6,060,932 A | 5/2000 | Devin | |
| 6,087,904 A | 7/2000 | Wen | |
| 6,259,390 B1 * | 7/2001 | Joe | 341/133 |
| 6,275,544 B1 | 8/2001 | Aiello et al. | |
| 6,278,754 B1 * | 8/2001 | Thomas et al. | 375/360 |
| 6,292,067 B1 | 9/2001 | Sasabata et al. | |
| 2001/0020907 A1 | 9/2001 | Joe et al. | |

FOREIGN PATENT DOCUMENTS

| | | |
|---|---|---|
| DE | DT 2602794 A1 | 7/1977 |
| DE | 24 59 531 A1 | 9/1977 |
| DE | 19809334 A1 | 9/1999 |
| FR | 1438262 A | 7/1966 |
| GB | 1036328 | 7/1966 |
| JP | 11074766 | 3/1999 |
| WO | WO 01/31868 A1 | 5/2001 |
| WO | WO 00/5597 A2 | 2/2002 |
| WO | WO 02/13385 A1 | 2/2002 |

OTHER PUBLICATIONS

Gallerani, A., "Oscillator Meets Three Requirements", EDN Access, pps. 119–120, Dec. 3, 1998.

Abell, E., "Gated Oscillator Emulates a Flip–Flop", EDN Access, pps. 1–2, Mar. 16, 1995.

L. Goras et al., "On Linear Inductance– and Capacitance–Time Conversions Using NIC–Type Configuration," IEEE Transactions on Industrial Electronics, vol. 40, No. 5, pp. 529–531 (Oct. 1993).

V.H. Jakubaschk, "das Große Elektronikbastelbuch," Deutscher Militärverlag, Leipzig, pp. 206–209 (1968).

James P. Keener, Analog Circuitry for the van der Pol and FitzHugh—Nagumo Equations, IEEE 1983, pps. 1011–1015.

U. Tietze et al., "Halbleiter–Schaltungstechnik, Fünfte, überarbeitete Auflage," Springer–Verlag, Berlin Heidelberg, New York, pp. 255–258 (1980).

Sen et al., Integration of GaAs/A1As Resonant Tunneling Diodes for Digital and Analog Applications with Reduced Circuit Complexity, Oct. 13–16, 1987.

D. Wang et al., "Image Segmentation Based on Oscillatory Correlation," Neural Computation, vol. 9, pp. 805–836 (1997).

Gang Li et al., "Performance of a Ratio–Threshold Diversity Combining Scheme in FFH/FSK Spread Spectrum Systems in Partial Band Noise Interference," Department of Electrical and Computer Engineering, and Communication Research Centre, IEEE 1992, pps. 0672–0676.

Gang Li et al., "Maximum–Likelihood Diversity Combining in Partial–Band Noise Interference Channel," Department of Electrical and Computer Engineering, and Communication Research Centre, IEEE 1993, pps. 507–511.

* cited by examiner

METHOD AND APPARATUS TO RECOVER DATA FROM PULSES

CROSS REFERENCE TO RELATED APPLICATIONS

This application is related to U.S. application Ser. No. 09/429,519 for A METHOD AND APPARATUS FOR COMMUNICATION USING PULSE DECODING, filed Oct. 28, 1999 and to U.S. application Ser. No. 09/429,527 for METHOD AND APPARATUS FOR GENERATING PULSES FROM ANALOG WAVEFORMS, filed Oct. 28, 1999, both of which are owned by the Assignee of the present invention and are herein incorporated by reference for all purposes.

BACKGROUND OF THE INVENTION

In any conventional digital communication systems, a carrier signal is received and processed by circuitry which will output generally an analogue waveform which represents the recovered "value" of the information carried in phase, frequency or amplitude of the carrier signal. There is a decision device which outputs the binary symbols (some can be very sophisticated such as soft decision) based on the information contained in the carrier signal itself. A binary symbol is defined as a symbol that consists of a binary digit or a sequence of binary digits.

With the development of electronic technologies, it has now been determined that transmission of radio frequency signals at the frequency of modulation is both possible and practical over a broad spectrum of frequencies. For example, U.S. application Ser. No. 09/429,527, entitled "Method and Apparatus for Generating Pulses from Analog Waveforms," filed Oct. 28, 1999 teaches that it is possible to decode a symbol that is embedded in each cycle of frequency of modulation. Therefore, novel methods for extracting information out of such signals are needed.

SUMMARY OF THE INVENTION

In accordance with the present invention, data is recovered from a signal comprising plural groups of pulses. Each group of pulses is characterized by one or more parameters. A group of pulses is identified. In the process, one or more of the parameters which characterize the group is measured. Based on the measurements, an information symbol is determined. This is repeated to recover the data contained in the signal.

In one embodiment of the invention, the signal is fed into two or more pipelines. Each pipeline processes two or more groups of pulses. Input delays are provided so that the groups of pulses being processed in each pipeline are offset by one or more groups. Additional delays are provided to the outputs of each pipeline in a manner that the processed groups of pulses are synchronized and delivered to a decision component. The decision component makes a determination of the information symbol based on the processed groups of pulses.

BRIEF DESCRIPTION OF THE DRAWINGS

The teachings of the present invention can be readily understood by considering the following detailed description in conjunction with the accompanying drawings.

DESCRIPTION OF THE SPECIFIC EMBODIMENTS

Figure 1:
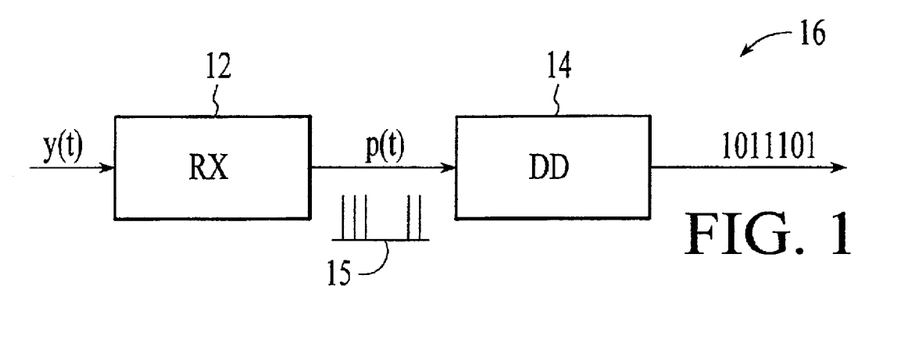
FIG. 1 illustrates a high-level block diagram of a portion of a data communication system, showing the invention in the context of the communication system.

FIG. 1 shows a block diagram of a receiver 12 and a decision device 14 as disclosed in U.S. application Ser. No. 09/429,519. A carrier signal y(t) is received and processed through receiver 12 to produce a signal 15, comprising a plurality of pulses (spikes). U.S. application Ser. No. 09/429, 527 discloses circuitry that can be used for receiver 12 in the present invention. The pulses in the signal are organized into groups of pulses. As will become clear, these groups of pulses contain information which can be extracted in accordance with the present invention.

Figure 2:
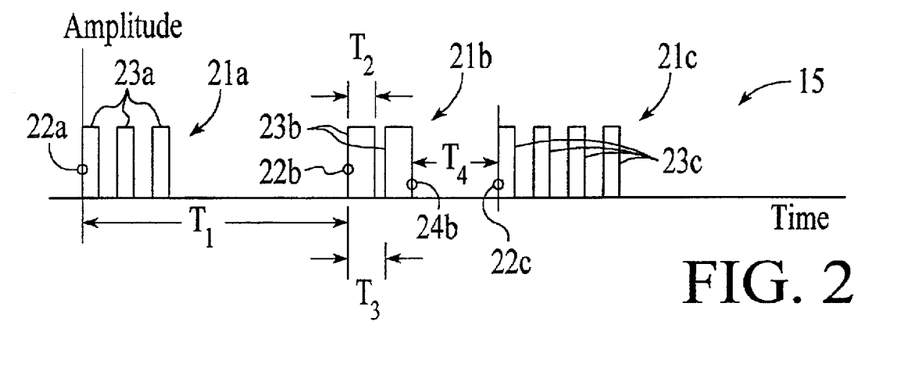
FIG. 2 illustrates typical signal parameters of interest according to the invention.

FIG. 2 shows signal 15 comprising a plurality of groups of pulses 21a–21c, produced at the output of receiver 12. The decision device 14 maps these groups of pulses onto an information character set so that each group of pulses represents an information character of the set. The binary set is the simplest and most common character set used in modern digital communication systems, comprising the information characters (i.e., binary symbols) "0" and "1".

Each group of pulses 21a–21c is characterized by various parameters. One such parameter is referred to as the "group period" $T_1$, shown in FIG. 2. The group period $T_1$, is the period of time between the rising edge 22a of the first pulse in one group of pulses 21a and the rising edge 22b of the first pulse in the subsequent group of pulses 21b.

Another parameter which characterizes the groups of pulses is referred to as the "pulse width". FIG. 2 shows that the pulse width is the width $T_2$ of each of the pulses (e.g., 23b) comprising a group of pulses.

A "pulse separation" is a parameter which represents the separation between the rising edge of one pulse in a group of pulses and the rising edge of the next pulse in that group of pulses. This is shown as time period $T_3$ in FIG. 2.

Each group of pulses is further characterized by a parameter called a "silent period." FIG. 2 shows this as time period $T_4$. This parameter represents the separation between groups of pulses. More specifically, it is the quiet period in the signal between the falling edge (e.g., 24b) of the last pulse in one group and the rising edge (e.g., 22c) of the first pulse in the subsequent group of pulses.

Another parameter is the number of pulses $N_p$ comprising a particular group of pulses.

In accordance with the invention, the foregoing described parameters are relevant for recovering data from a signal comprising groups of pulses. The groups of pulses which constitute the signal exhibit the property that one or more of the parameters which characterize each group of pulses can vary from one group to the next. Thus, let the set S={$T_1$, $T_2$, $T_3$, $T_4$, $N_p$} characterize a group of pulses. If $S_1$ characterizes a first group of pulses and $S_2$ characterizes a second group of pulses, then the first group is different from the second group if at least one of $T_1$, $T_2$, $T_3$, $T_4$, and $N_p$ in the first group pulses is different from the corresponding parameter in the second group of pulses. For example, one group of pulses 21a may differ from another group of pulses 21b with respect only to their respective "group period" parameter $T_1$. However, the invention contemplates that groups of pulses may differ from one another with respect to two or more parameters. Thus, the group period $T_1$, and the number of pulses $N_P$ of one group of pulses may be different from the group period and the number of pulses of another group of pulses.

Communication is achieved by detecting the signal and the groups of pulses in the signal. First, the parameter(s) characterizing a group are determined. Then, on the basis of one or more of the parameters, an information symbol representing the information contained in the signal is identified. This is repeated to produce a stream of information from the signal.

In the case of symbols representing binary data, for example, suppose four different groups of pulses are used to represent four symbols, each corresponding to binary symbols: 00, 01, 10, and 11. In accordance with the invention, it can be decided a priori to use the "number of pulses" parameter $N_p$ to identify the information symbols. Thus, for example, $N_p=2$ might map an information symbol for '00', $N_p=5$ might map an information symbol for '01', $N_p=7$ might map an information symbol for '10', and $N_p=9$ might map an information symbol for '11'. The particular values for $N_p$ of course depend on the nature of the signal, the hardware, performance criteria, signal to noise performance, and other such considerations.

The most general case in accordance with the invention is to allow any combination of parameters S to represent the information symbols. Thus, for example, communication may occur in accordance with the following a priori convention: the $N_p$ parameter is used to identify '00', so that groups of pulses which contain, for example, $N_p=6$ pulses will map to an information symbol representing '00'; the parameter $T_1$ is used to identify '01', so that groups of pulses whose group period, for example, is $T_1=t_{01}$ will map to an information symbol representing '01'; the $N_p$ parameter is used to identify '10', so that groups of pulses which contain, for example, $N_p=10$ pulses will map to an information symbol representing '10'; and the parameter $T_2$ (pulse width) is used to identify '11', so that groups of pulses whose pulse width, for example, is $T_1=t_{11}$ will map to an information symbol representing '11'.

Observe that in the general case, prioritization may be needed. In the foregoing example, a group of pulses may have an $N_p=6$ and a $T_1=t_{01}$. This results in an ambiguous situation: does the group of pulses represent '00' or '01'? It can be decided a priori that the $T_1$ parameter has precedence, so that the group of pulses would map to '01'. A '00' group would have to have $N_p=6$ and a $T_1 \neq t_{01}$. Similar rules of precedence must be developed to avoid such ambiguity among the information symbols.

Following are illustrative embodiments of the invention, showing by example how these parameters can be utilized to recover data. Based on the teachings which follow, one of ordinary skill will be able realize additional embodiments that fall within the scope of the invention as claimed without undue experimentation.

Pulse Counting Method

Figure 3:
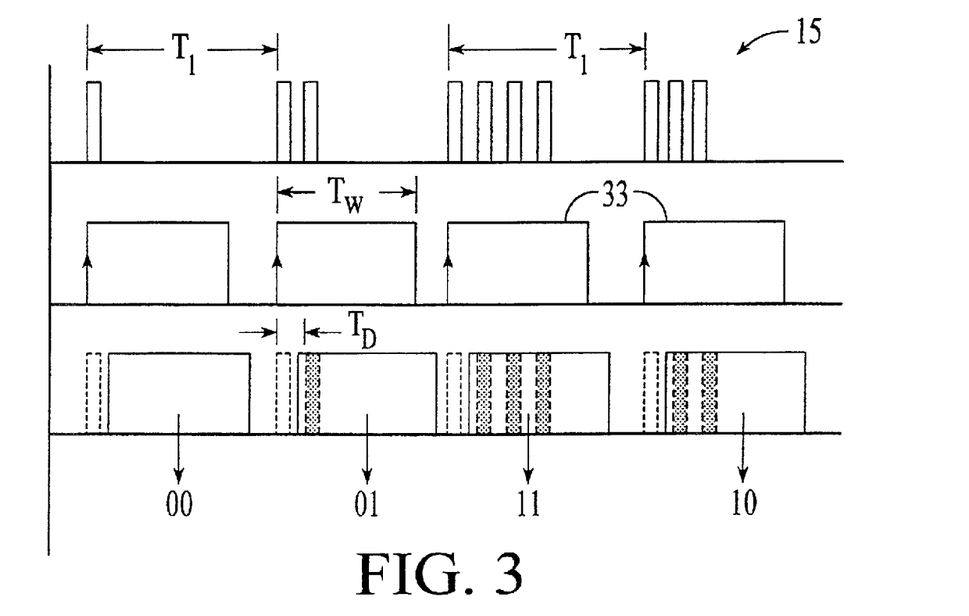
FIG. 3 shows an illustrative example of an embodiment of the invention using a pulse counting method.
Figure 9:
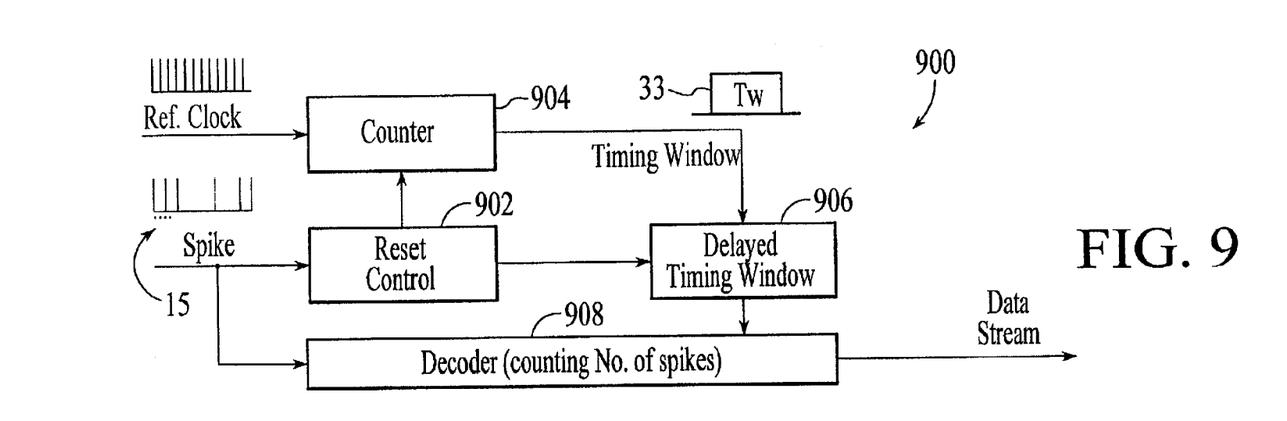
FIGS. 9–14 shows illustrative circuits for data recovery according to the embodiments shown in FIGS. 3–8, respectively.

FIGS. 1, 3, and 9 show an example of a data recovery circuit 900 (FIG. 9) according to an illustrative embodiment of the invention. Detection is based primarily on the number of pulses within a group period. To illustrate the decoding process, assume there are, but not limited to, four binary symbols, 00, 01, 10, 11, used to transmit data. FIG. 3 shows how to recognize and recover the different symbols sent. The receiver 12 (FIG. 1) provides groups of pulses (spikes) 15 at the receiver's output. The groups of pulses feed into a reset control 902, which serves to trigger the reset input of a counter 904 that is driven by a reference clock.

The rising edge of the first pulse of each group of pulses will trigger the counter 904, and thus open a counting window 33 for a period of time $T_W$. The window $T_W$ is set to be equal to the smallest $T_1$ expected to occur among the groups of pulses in the signal; with the restriction that the group of pulses comprising the most pulses spans a period of time $<T_W$. The counting window 33 feeds into a delay circuit 906 to shift the window forward in time by an amount $T_D$ to produce a delayed counting window.

The groups of pulses 15 feed into a counter/decoder 908. The output of the delay circuit 906, which is the delayed counting window 33, is coupled to a trigger input of the counter/decoder. Consequently, counting by the counter/decoder is delayed by an amount $T_D$ after detecting the first pulse of a group of pulses. The delay is introduced to prevent any delay produced by the logic gate from causing error in the decoding.

The counter 908 is incremented by the rising edge of each pulse encountered during the counting period $T_W$. At the end of the counting window, the number of counts is mapped to an information symbol to produce the data. For example, if three pulses are counted, then a binary symbol "11" will be generated, etc. This mapping of pulses to binary data constitutes the "decoder" part of the counter/decoder circuit. The counter/decoder resets at the falling edge of the counting window 33 and is re-activated when the next delayed counting window is opened.

Group Period Detection Method

Figure 4:
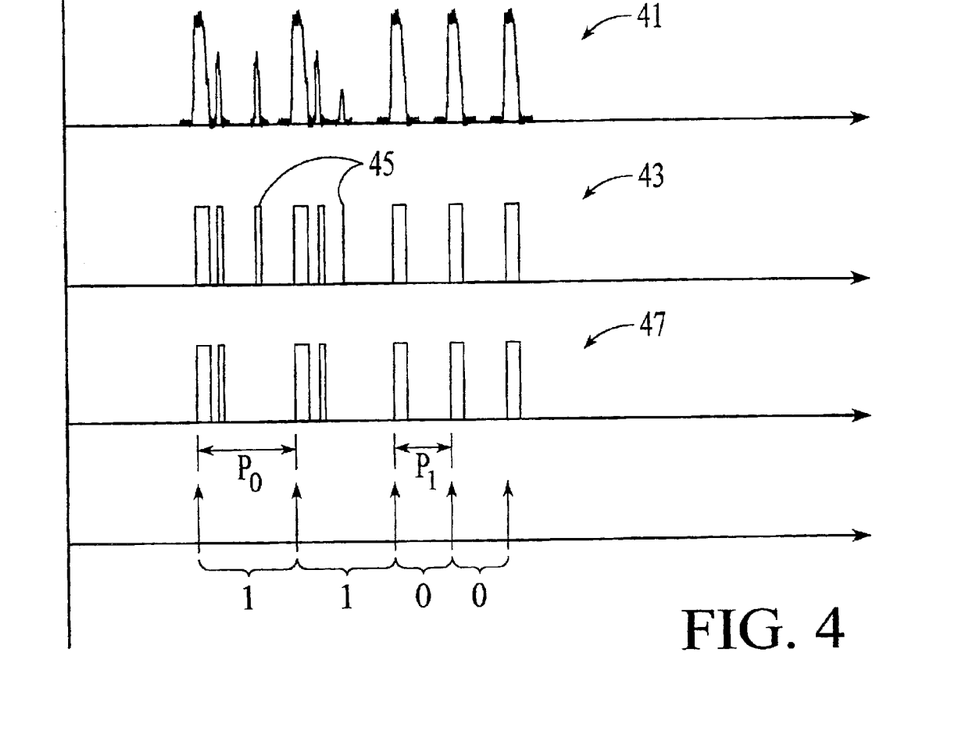
FIG. 4 shows a data recovery method in accordance with the invention that employs group period detection.
Figure 10:
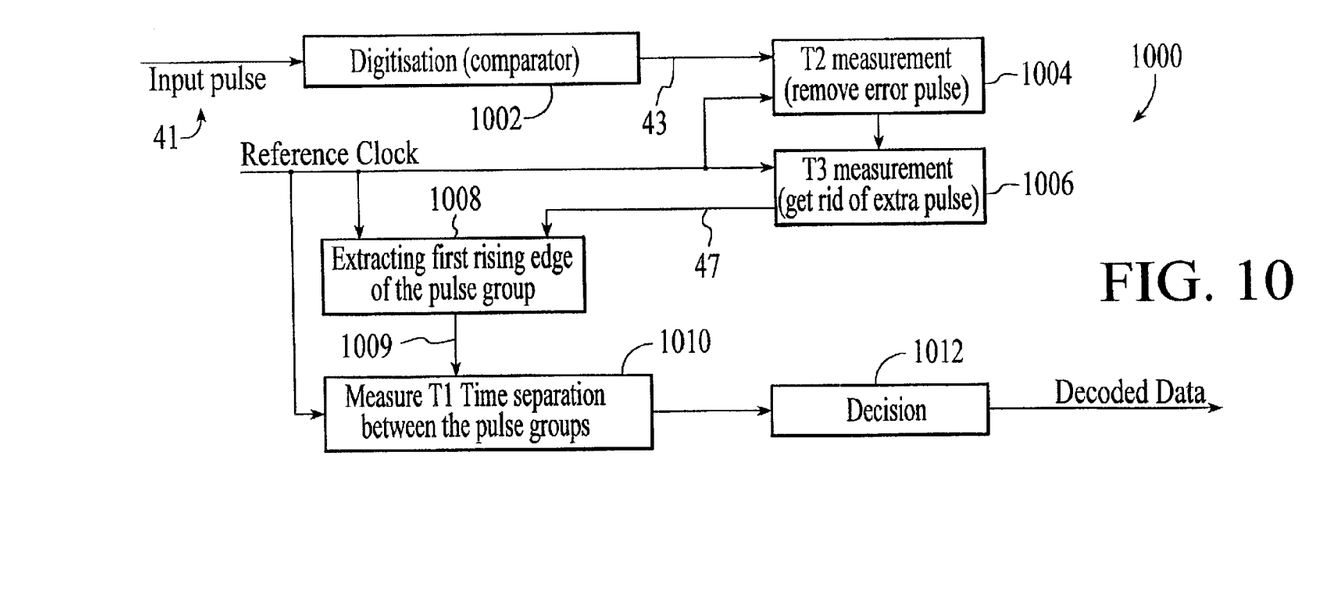

FIGS. 1, 4, and 10 show an example of a data recovery circuit 1000 and its operation according to further teachings of the invention. Parameters $T_1$, $T_2$, and $T_3$ are utilized, along with a reference clock whose period is much smaller than the smallest parameter $T_2$ or $T_3$ in any group period. An example is shown in FIG. 4 to illustrate how this method is applied to recover data comprising two binary symbols, 0 and 1, from a signal comprising groups of pulses.

Groups of pulses 41 are typical pulses observed at the output of receiver 12, after the signal y(t) is processed through a Gaussian white noise channel. These groups 41 are passed through a comparator 1002 to yield digitized groups of pulses 43. Pulses 45 are additional pulses generated due to the influence of noise. Using the reference clock activated by the rising edge of each pulse, measurements for parameters $T_2$ and $T_3$ are obtained. Determination logic 1004, 1006 measure the $T_2$ and $T_3$ parameters from the signal 43 and compare the measured $T_2$ and $T_3$ parameters to the expected $T_2$ and $T_3$ parameters for each group period. The extraneous pulses 45 can be removed because the pulses are either too thin (much smaller than expected $T_2$) or $T_3$ too large but is still within $T_1$. Removing these false pulses 45, produces new groups of pulses 47. The pulses 47 feed into an edge detector 1008 to produce a trigger signal 1009 which in turn feeds into a measurement circuit 1010. Using the reference clock activated by the rising edge of the first pulse to measure the group period $T_1$, the binary symbols 0 and 1 can be recovered from decision circuit 1012. For example, if $T_1$ is approximately equal to P0, then binary symbol 1 will be generated. If $T_1$ is approximately equal to P1, then binary symbol 0 will be generated.

Width of Group of Pulses Detection Method

Figure 5:
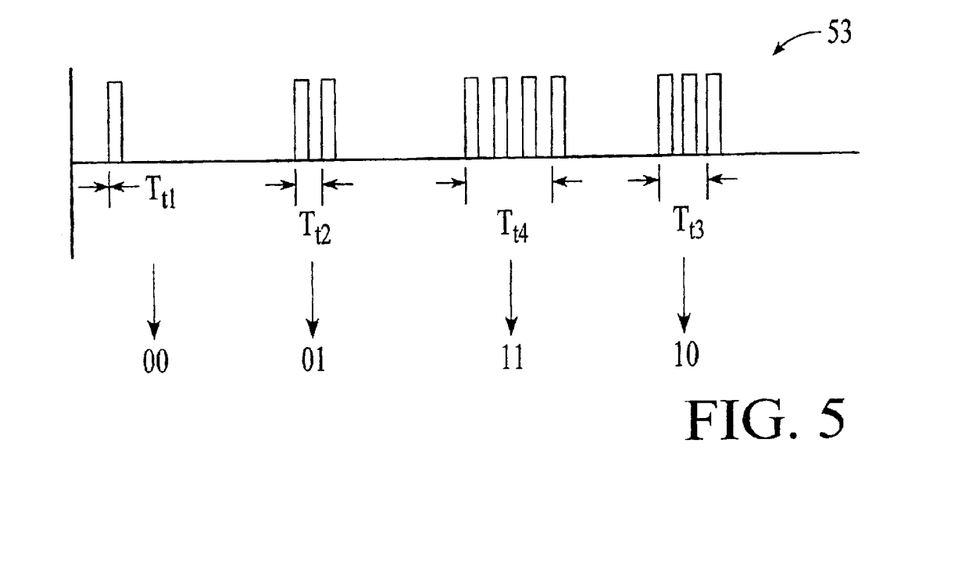
FIG. 5 illustrates another embodiment of the invention wherein data recovery is based on pulse width.
Figure 11:
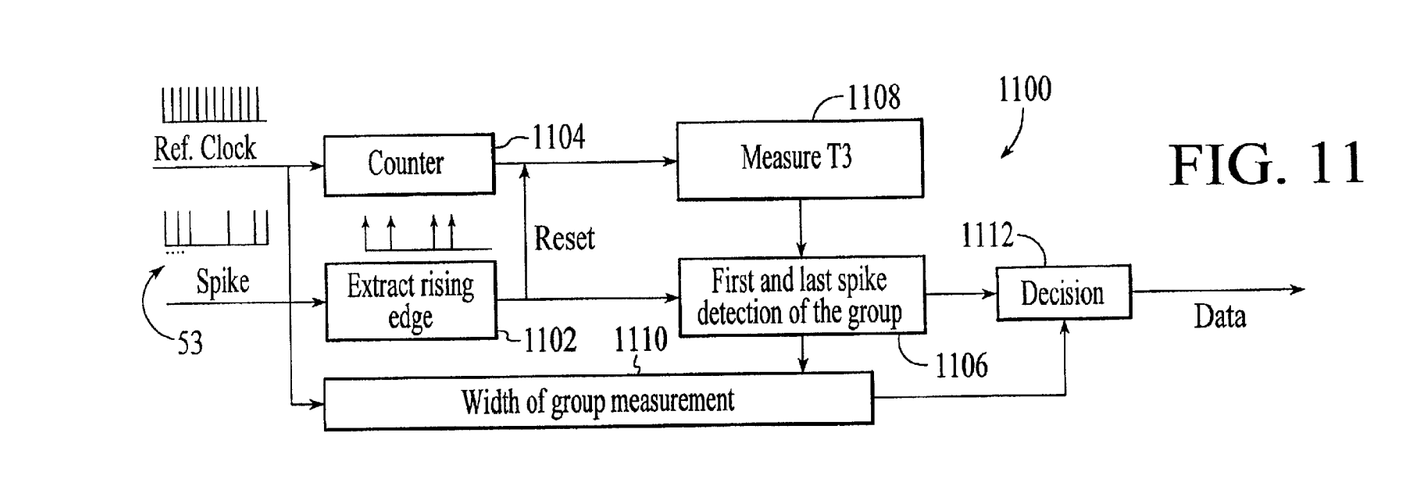

FIGS. 1, 5, and 11 show an example of a data recovery circuit 1100 and its operation for recovering data from a signal comprising plural groups of pulses according to another illustrative embodiment of the invention. Parameters $T_3$ and $T_4$ are used in conjunction with a reference clock whose period is much smaller than the smallest $T_3$ parameter expected to occur in any group of pulses. Usually, $T_4$ is much larger than $T_3$. Though FIG. 5 illustrates recovery for four binary symbols, this embodiment of course is not limited to four symbols.

The reference clock feeds into a counter 1104. The counter is triggered by a signal from an edge detector 1102. The edge detector receives the signal 53, and is configured to produce a reset signal upon detecting the rising edge of each pulse in the signal. The reset signal feeds into the counter to reset the counter.

The output of counter 1104 feeds into a circuit 1108 which measures the time between pulses to produce a measurement for the $T_3$ parameter. Detection circuit 1106 determines the end of one group of pulses and the beginning of the next group of pulses based on the $T_3$ measurement provided by the circuit 1 108 and the parameter $T_4$. In accordance with this embodiment of the invention, the smallest $T_4$ expected to occur in the signal 53 will be used as a threshold to decide whether the next rising edge belongs to the next group of pulses. This threshold is set a priori. When the measured $T_3$ exceeds $T_4$, then detection circuit 1106 produces a trigger signal that feeds into a decision block 1112 and a reset signal that feeds into a counter 1110.

When the rising edge of the first pulse of a group of pulses in the signal 53 is detected, the counters 1104 and 1110 will start running. The circuit 1108 measures the time length $T_3$ to the rising edge of the next pulse, based on the output of the counter 1104. The counter 1110 continues to run so long as the measured $T_3$ remains less than $T_4$, as determined by detection circuit 1106. The effect of this action is to add successive $T_3$'s together.

When a measured $T_3$ is greater than $T_4$, the reset signal from the detection circuit 1106 stops the counter 1110. The total time measured by the counter 1110 (i.e. the running sum of successive $T_3$'s) constitutes the temporal width of the group of pulses. This width information feeds into the decision block 1112, which is triggered by the trigger signal from the detection circuit 1106. The width of the group of pulses is compared to predefined time periods $T_{t1}$, $T_{t2}$, $T_{t3}$, and $T_{t4}$ contained in the decision block. The decision block maps to information symbols '00', '01', '10', and '11', respectively, on the basis of the result of the comparison to the predefined time periods. For example, if the total clock time is approximately equal to $T_{t2}$, then information symbol '01' will be generated.

Differential Group Period Detection Method

Figure 6:
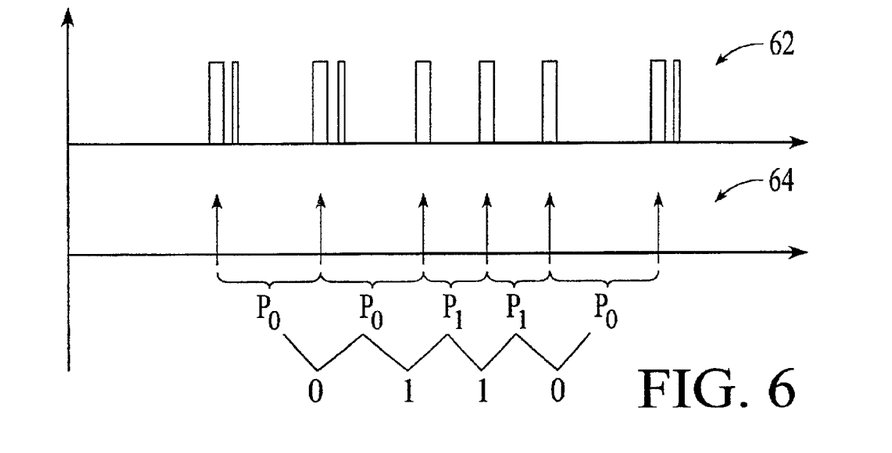
FIG. 6 illustrates an embodiment of the invention that is a variation of the group period detection shown in FIG. 4.
Figure 12:
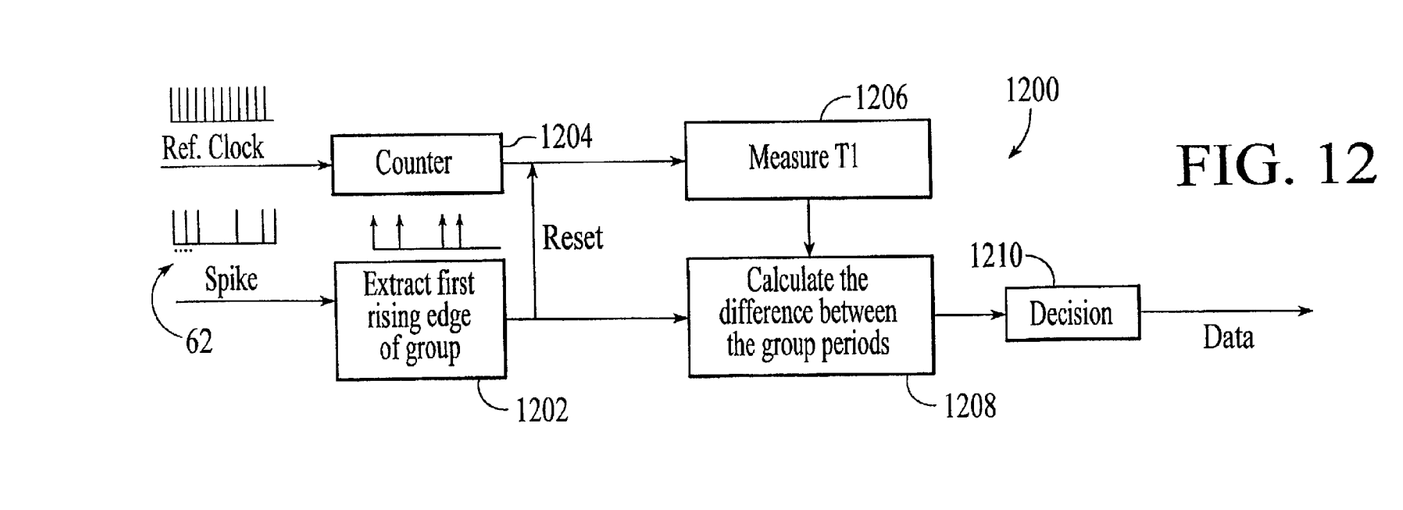

Referring to FIGS. 1, 6 and 12, an example of a data recovery circuit 1200 its operation are described in accordance with yet another illustrative embodiment of the invention. The technique of this embodiment utilizes parameters $T_1$ and $T_3$, and a reference clock. The reference clock feeds into a counter 1204 to measure the time between two rising edges of the pulses. This is accomplished by feeding the signal 62 into an edge detection block 1202 which detects the rising edge of the first pulse in a group of pulses, and produces a reset signal in response thereto.

By using the parameter $T_3$, this method will be able to differentiate whether a pulse belongs to the same group of pulses or the next group of pulses. After knowing the time between two adjacent pulses in each group of pulses 62, the subsequent pulses after the first pulse of each group of pulse are removed and only the rising edges 64 of the first pulse of each group of pulses remain.

The group period $T_1$ is then determined by triggering the counter 1204 on the rising edge of the first pulse from each group of pulses and feeding the output of the counter 1204 to a measurement block 1206. The counter continues counting until it is triggered again by the first pulse in the next group of pulses. The measurement block determines the length of time between each trigger event of the counter.

The output of the measurement block feeds into a calculation block 1208. The calculation block is triggered by the reset signal from the edge detection block 1202. Consequently, a calculation occurs upon detecting the occurrence of the beginning of each group of pulses. The calculation that is performed is the difference between successive $T_1$ measurements, thus producing a sequence of times between successive groups of pulses, namely $\Delta T_1$'s.

The output of the calculation block 1208 feeds into a decision block 1210. The decision block maps the $\Delta T_1$'s to predefined binary values, thus providing for recovery of the data from the signal 62. In this example shown, when the parameter $T_1$ changes from $P_0$ to $P_1$ and from $P_1$ to $P_0$, binary symbol 1 and 0 are generated, respectively. If there is no change in the parameter $T_1$, the same binary symbol as the previous one is generated.

Conceptually, this idea can be extended to include any decoding method where the changes of parameters or the number of pulses from the first group to the second group of pulses are utilized.

Simultaneous Pipeline Decoding Method

Figure 7:
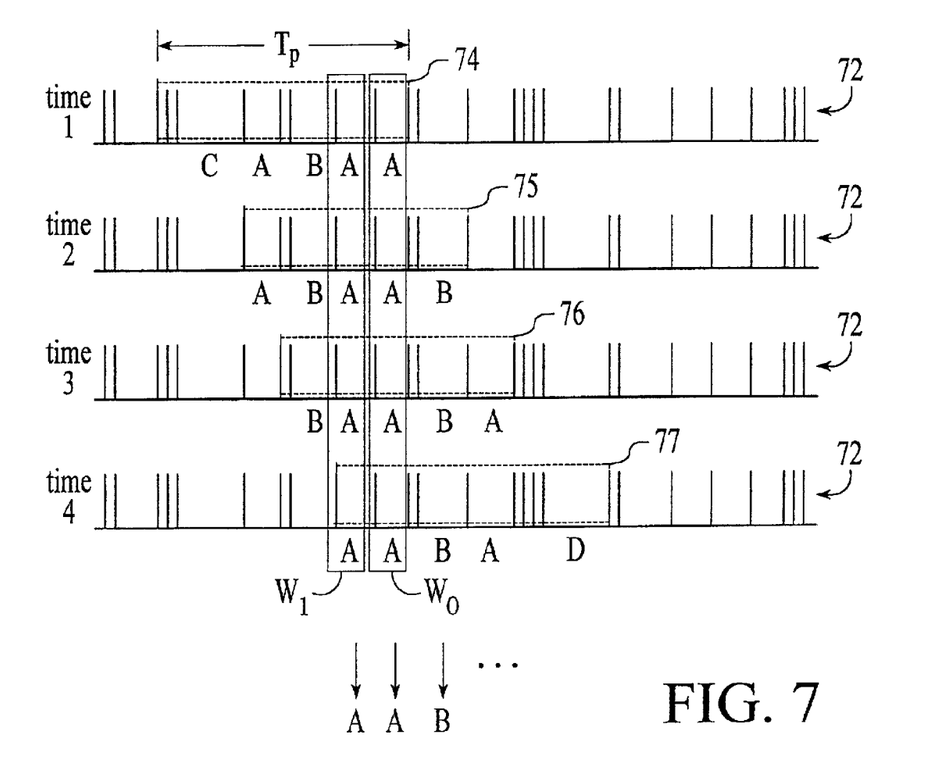
FIG. 7 teaches a pipeline processing method for data recovery in accordance with the invention.
Figure 13A:
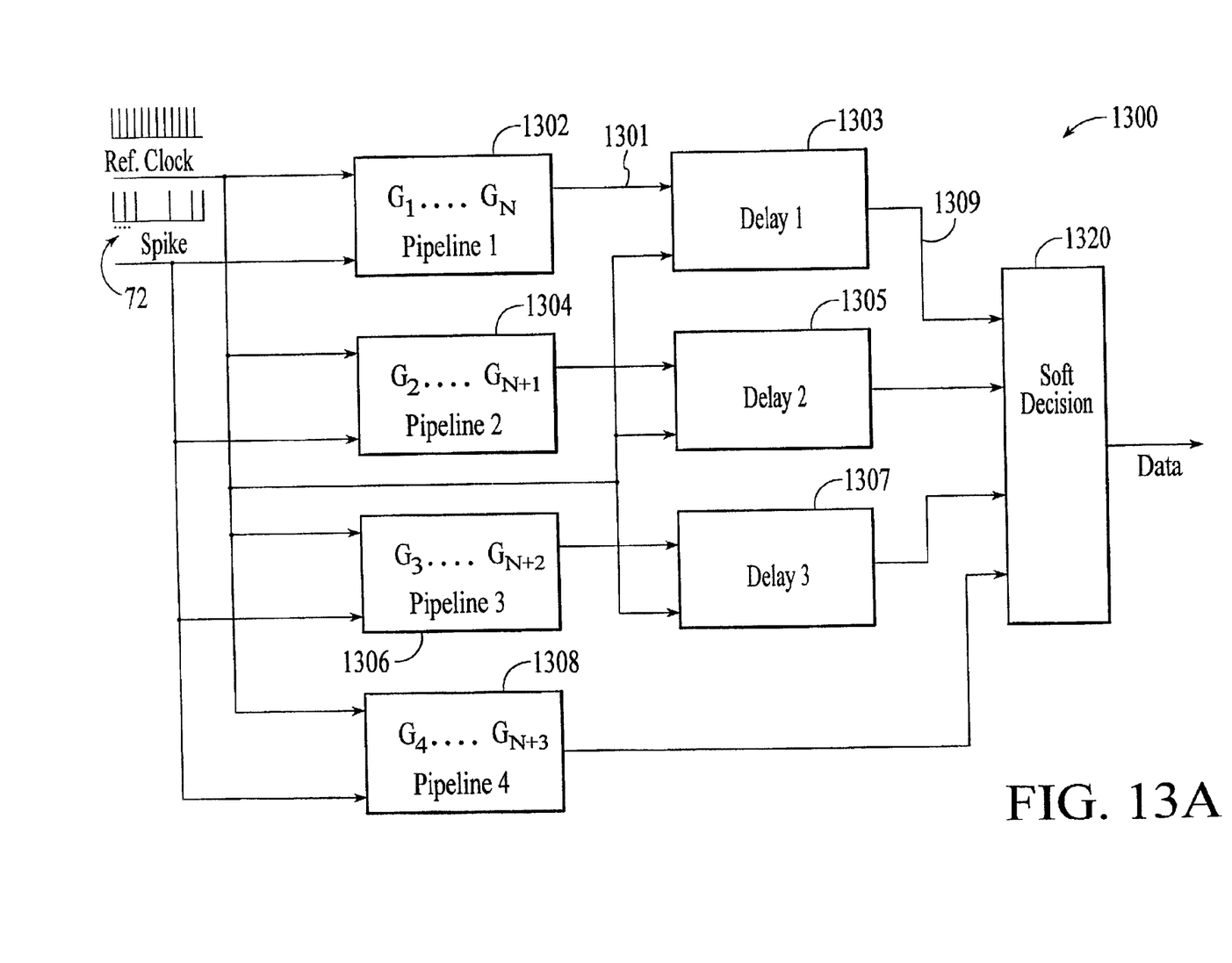

FIGS. 1, 7, and 13A show yet another illustrative embodiment of the invention, utilizing parameters $T_1$, $T_3$, and $N_p$. This embodiment of the invention requires a reference clock whose period is much smaller than the smallest $T_3$ parameter expected to occur in any group of pulses.

The signal 72 feeds into a series of pipeline stages 1302–1308, wherein several of the groups of pulses comprising the signal are simultaneously decoded in pipeline fashion. The reference clock feeds into each of the pipelines 1302–1308.

At time1. the first pipeline 1302 receives the signal 72 without delay and is shown processing groups of pulses 74, $G_1$–$G_N$. The values for one or more of the parameters for each of the groups $G_1$–$G_N$ are determined (measured) in the first pipeline at time1. Based on the measurements, each group of pulses $G_1$–$G_N$ is decoded to produce a corresponding symbol; e.g. a binary symbol. The symbols are delayed by delay unit 1303, after which each symbol is delivered to a soft decision component 1320, one symbol at a time. For reasons explained below, delay unit 1303 provides a delay of three groups of pulses.

The delay unit 1303 provides a variable delay capability. Since the group period $T_1$ can vary from one group of pulses to the next group of pulses, the delay unit must be able to delay the symbols on the basis of each symbol's corresponding group of pulses. Thus, as the symbols from the first pipeline 1302 feed into the delay unit, a delay corresponding to the symbol is provided, using the reference clock as a time base.

Continuing, the signal 72 also feeds into the second pipeline 1304. As will be explained below, the second pipeline provides an internal delay of one group, so that the second pipeline processes groups of pulses 75, $G_2-G_{N+1}$. A set of measured parameters for groups of pulses $G_2-G_{N+1}$ is produced in the second pipeline at time2 (FIG. 7). Based on the measurements, each group of pulses $G_2-G_{N+1}$ is decoded to produce a corresponding symbol. The symbols are delayed by delay unit 1305 on their way to the soft decision component 1320. The delay unit 1305 is configured to operate in the same manner as the delay unit 1303. For reasons that will be explained below, delay unit 1305 provides a delay of two groups of pulses.

Continuing, the signal 72 also feeds into the third pipeline 1306. As will be explained below, the third pipeline provides an internal delay of two groups, so that at time3 (FIG. 7) the third pipeline processes groups of pulses 76, $G_3-G_{N+2}$ to produce a third set of measured parameters. Based on the measurements, each group of pulses $G_3-G_{N+2}$ is decoded to produce a corresponding symbol. The symbols are delayed by delay unit 1307, after which each symbol is delivered to the soft decision component 1320, one symbol at a time. The delay unit 1307 is configured to operate in the same manner as the delay units 1303 and 1305. For reasons to be explained the delay unit 1307 provides a delay of one group of pulses.

Continuing, the signal 72 also feeds into the fourth pipeline 1308. As will be explained below, the fourth pipeline provides an internal delay of three groups, so that at time4 (FIG. 7) the fourth pipeline processes groups of pulses 77, $G_4-G_{N+3}$ to produce a fourth set of measured parameters. Based on the measurements, each group of pulses $G_4-G_{N+3}$ is decoded to produce a corresponding symbol. The symbols are delivered to the soft decision component 1320 one symbol at a time, without delay.

Figure 13B:
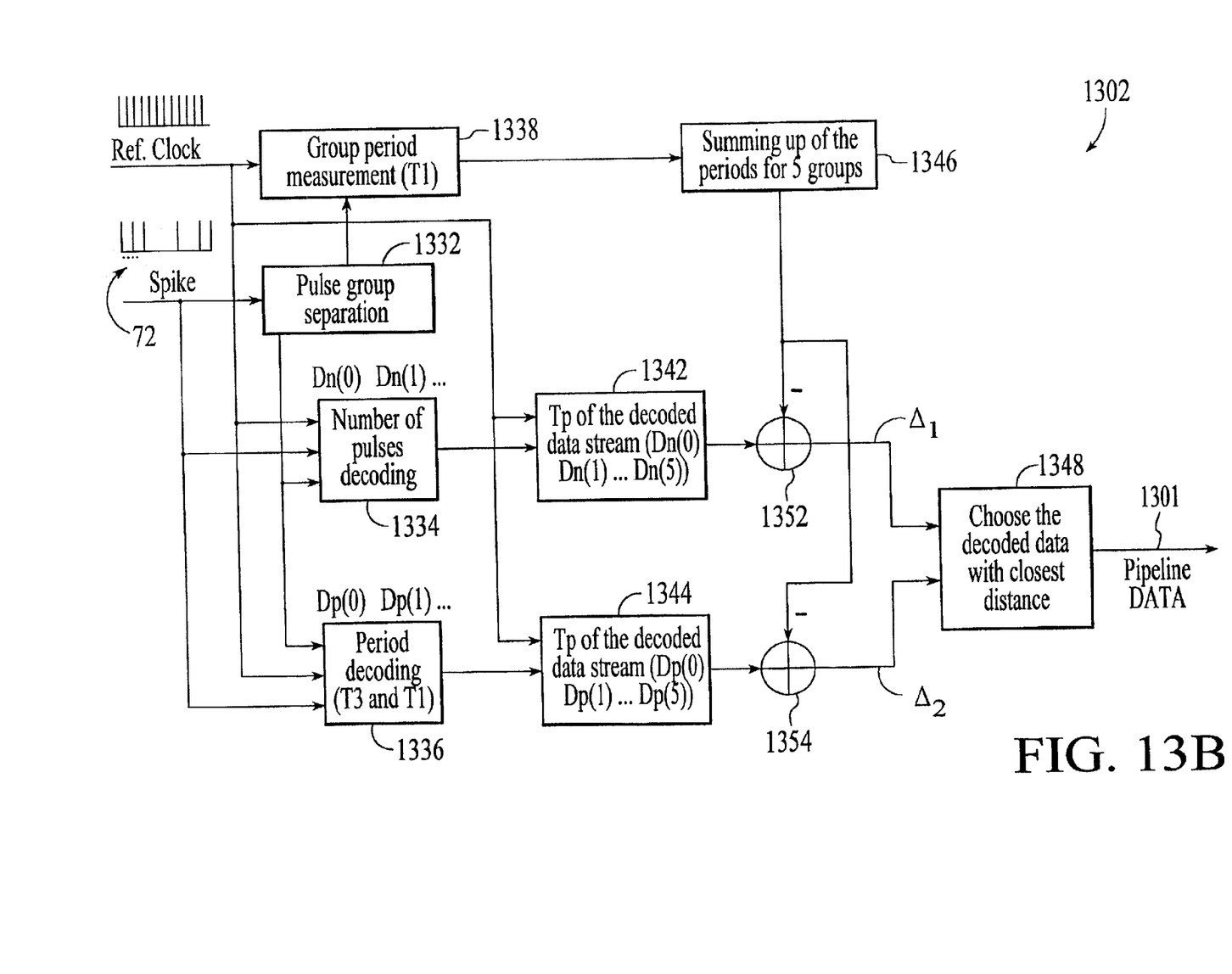

Referring now to FIG. 13B, an illustrative embodiment of the first pipeline 1302 is shown. It is understood that the remaining pipelines 1304–1308 are similarly configured, with the noted differences. The incoming signal 72 feeds into a group separation unit 1332 which identifies the groups of pulses in the signal. The group separation unit produces a trigger signal to trigger a group period measurement component 1338 to produce a measurement of the group period $T_1$ of each detected group. A group period summer 1346 keeps a running total for a number of group periods. In accordance with the processing shown in the illustrative embodiment of FIG. 7, each pipeline 1302–1308 processes five groups of pulses. Consequently, the group period summer totals the group periods for five groups. The output of the group period summer is delivered to summers 1352 and 1354.

The group separation unit 1332 also provides a signal to a first decoding unit 1334 and to a second decoding unit 1336. The decoder units each receives five groups of pulses to produce five symbols. In the illustrative embodiment, the decoding unit 1334 is a number-of-pulses decoder and the decoding unit 1336 is a period decoder. These decoders have been discussed previously. Other decoding techniques can be used for the decoder units. Additional decoder units can be provided as well.

Each decoder unit 1334 and 1336 feeds into a period determining component 1342 and 1344, respectively. Since a different decoding technique is used, each period determining component 1342, 1344 may produce a different total group period value ($T_P$). The period determining components 1342 and 1344 feed the period values to the summers 1352 and 1354, respectively. The summers produce delta values $\Delta_1, \Delta_2$ which feed into a decision component 1348. The decoded symbols (e.g., binary symbols comprising a bit stream) of the decoding unit (1334 or 1336) having the smallest associated delta value $\Delta_1, \Delta_2$ will be selected by the decision component and produced at its output 1301. Referring back to FIG. 13A, the output feeds into the first of the delay units 1303. In the case where the decoded symbols represent binary data, the pipelines 1302–1306 feed streams of bits into their respective delay units 1303–1307.

Recall that pipelines 1304–1308 each provide internal delays so that the groups of pulses being processed are offset by one group of pulses in each pipeline. This is achieved by configuring the group separation unit 1332 accordingly. Thus, in the second pipeline 1304, the group separation unit does not begin operation until one group of pulses has been detected. This occurs, for example, when the system is powered up, initialized, booted, or otherwise reset. Likewise, the third pipeline 1306 does not begin operation until two groups of pulses have been detected. Similarly, the fourth pipeline 1308 does not begin operation until three groups of pulses have been detected. In this way, processing in the second pipeline will always be one group of pulses behind the first pipeline 1302. Processing in the third pipeline will always be two groups of pulses behind the first pipeline, and processing in the fourth pipeline will always be three groups of pulses behind the first pipeline.

Returning to FIG. 13A, the combined actions of the delay units 1303–1307 have the effect of ensuring that a decoded symbol from the same group of pulses from each of the pipelines 1302–1308 is delivered to the soft decision component 1320. For example, referring to FIG. 7, during window $W_0$, it can be seen that the decoded symbol 'A' is decoded from the same group of pulses in each pipeline, and is delivered to the soft decision component from each of the pipelines. Likewise with window $W_1$.

Figure 13C:
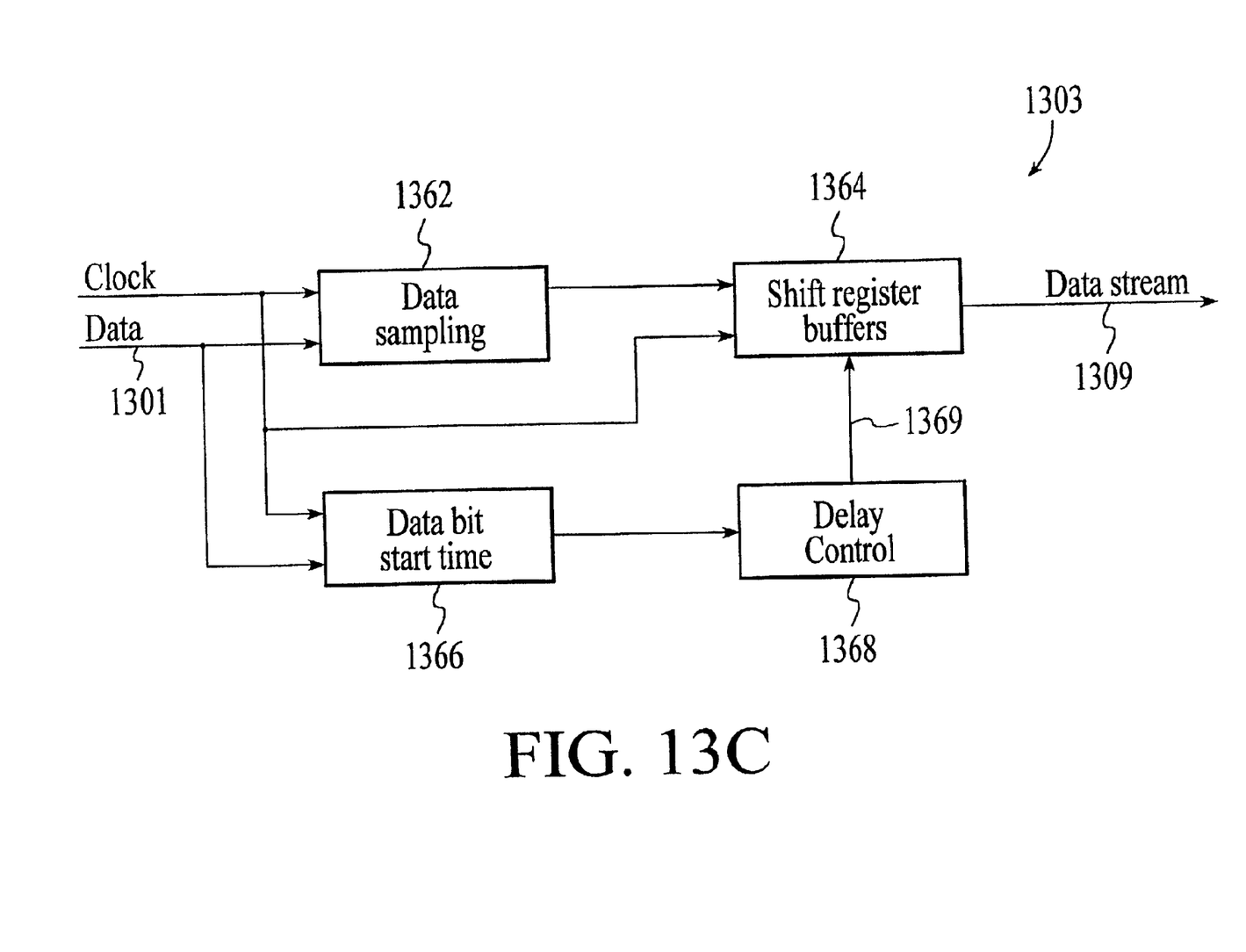

FIG. 13C illustrates an embodiment of the delay unit 1303. The delay units 1305 and 1307 are similarly configured. The delay unit 1303 receives the output 1301 of the pipeline 1302, which comprises a stream of decoded symbols, e.g., a bitstream. The clock signal feeds into the delay unit also. A data sampling component 1362 samples the incoming data and feeds the data to a set of shift registers which constitute a buffer 1364. A data bit timer 1366 produces a control signal. The control signal feeds into a delay control component 1368 to enable outputting of a clocking signal 1369 that clocks the registers in the buffer 1364. The data bit timer delays operation of the delay unit by a certain amount, from the onset of operation of the system. As indicated above, the delay bit timer in the delay unit 1303 is configured to provide a delay of three groups of pulses at system startup. The delay bit timer in the delay unit 1305 is configured to provide a delay of two groups of pulses at system startup. The delay bit timer in the delay unit 1307 is configured to provide a delay of one group of pulses at system startup.

Returning to FIG. 13A, the presence of the soft decision component 1320 is motivated by the fact that noise in the signal may cause the same group of pulses in each pipeline to decode (map) to a different symbol. The reason for this phenomenon is fact that the parameters of a group of pulses are determined with respect to the set of groups in any one pipeline. Thus, parameters for each of groups 74, $G_1-G_N$ are determined relative to the groups of pulses in the first pipeline 1302 at time1 (FIG. 7). Likewise, the parameters for each of groups 75, $G_2-G_{N+1}$ are determined relative to the set of groups in the second pipeline 1304 at time2. The parameters for each of groups 76, $G_3$–$G_{N+2}$ are determined relative to the set of groups in the second pipeline 1306 at time3, and the parameters for each of groups $G_4$–$G_{N+3}$ are determined relative to the set of groups in the second pipeline 1308 at time4. There is usually dependency among groups of pulses, so that the parameters measured for any one group of pulses will depend on the groups of pulses which participate in the measurement. The parameters measured for group $G_3$ in the first pipeline 1302, for example, may differ from the parameters measured for group $G_3$ in the third pipeline 1306. The cause of the discrepancy is due to noise and other factors, e.g., channel interference. Consequently, the symbol that is produced from group $G_3$ in the first pipeline may be different from the symbol that is produced from $G_3$ in the third pipeline.

Referring back to FIG. 7, then, it is possible that the symbols delivered to soft decision component 1320 from the four pipelines 1302–1308 during window $W_0$ may not all be the symbol 'A'. In accordance with the illustrative example of this embodiment of the invention, the soft decision component 1320 produces a final symbol by selecting the candidate symbol that occurs with the highest frequency. Thus, as can be seen in FIG. 7, each of the four pipelines 1302–1308 is shown delivering the symbol 'A' to the soft decision component, and so the data produced is 'A'. Likewise for window $W_1$.

In the illustrative embodiment, the soft decision component simply uses a highest-frequency-of-occurrence test, which offers the advantage of straightforward implementation. However, many variations of the foregoing illustrative embodiment of the present invention are possible. For example, the foregoing teaches processing each group of pulses in the pipelines 1302–1308 to the point of mapping the group to an information symbol (e.g., a binary symbol), and then feeding the candidate symbols to the soft decision component 1320 which algorithmically decides on the final symbol based on the candidate symbols.

Alternatively, processing within each pipeline 1302–1308 can stop after producing the measured parameters, without mapping to an information symbol. Rather than delivering candidate symbols to the soft decision component 1320, the parameters themselves can be presented to the soft decision component. The soft decision component can produce a final symbol algorithmically based on the parameters themselves, or by a mathematical treatment of the parameters. For example, the $T_1$ parameter from each of the four pipelines can be averaged to produce an average value for $T_1$. The computed average value can then be the basis for mapping to the final symbol. Clearly, alternate similar processing by the soft decision component is within the capability of one of ordinary skill in view of the above teachings.

The foregoing illustrative example of the invention discloses an embodiment in which each of the pipelines 1304–1308 is delayed relative to the previous pipeline by one group of pulses. Alternatively, each successive pipeline can be configured to provide an effective delay of more than one group of pulses, along with appropriately configured delay units 1303–1307. Additional pipelines can be provided, and so on. The foregoing teachings place within the reach of one of ordinary skill other variations that fall within the scope of the invention without the need for undue experimentation and without departing from the scope of the claims defining the present invention.

Matched Window Method

Figure 8:
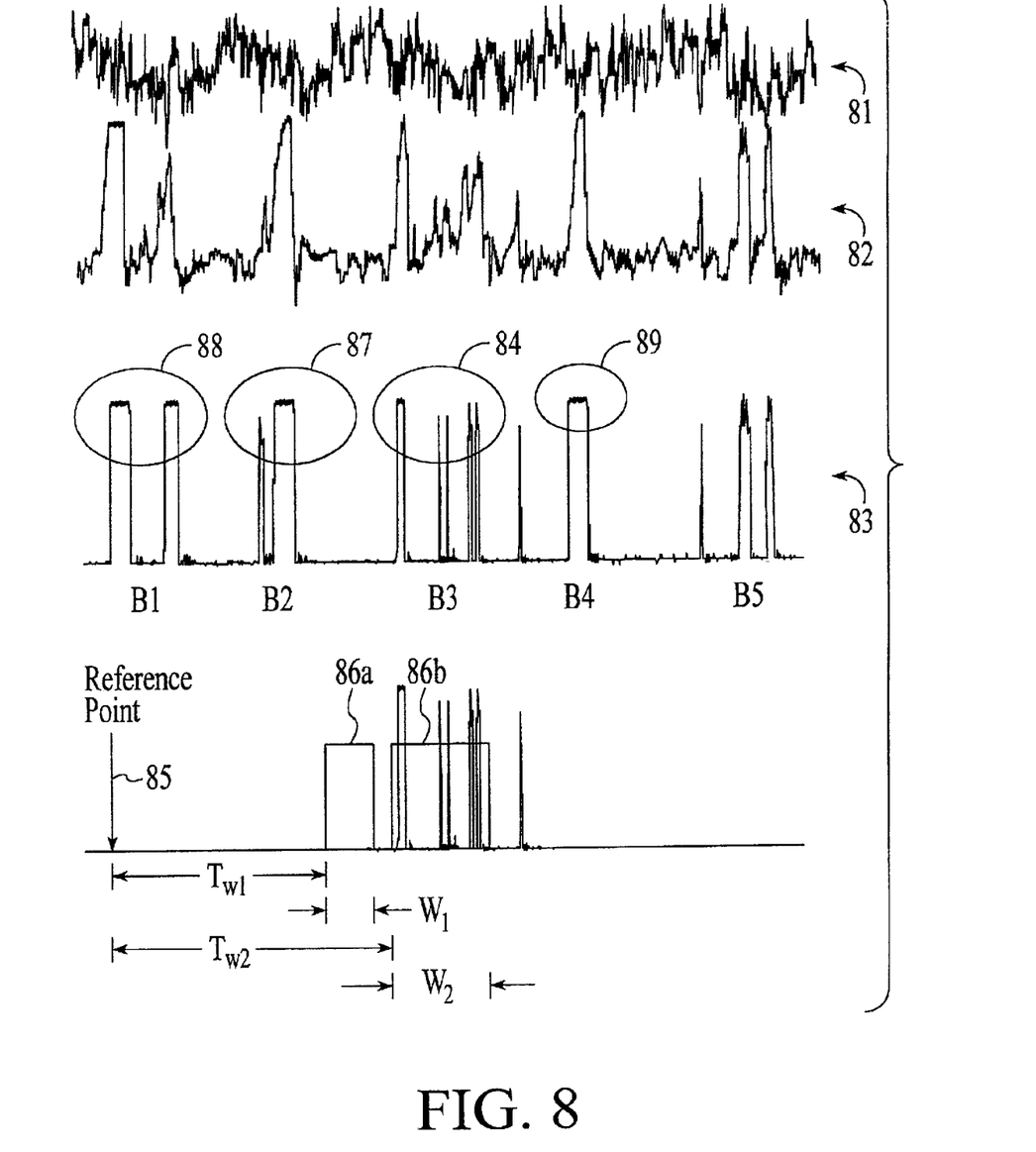
FIG. 8 discloses a matched window method for data recovery in accordance with the invention.
Figure 14:
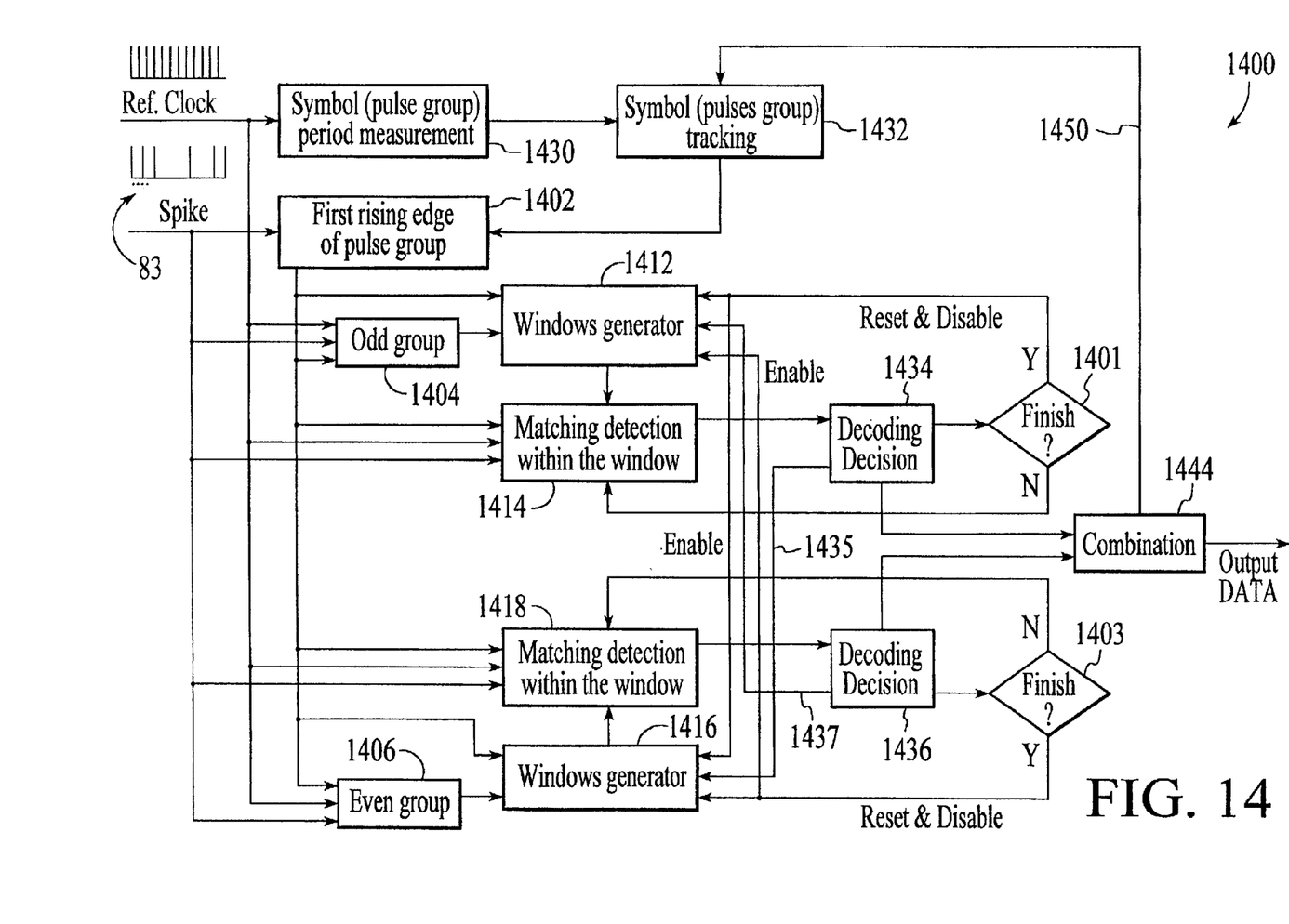

Referring to FIGS. 1, 8, and 14, data detection according to still further teachings of the invention uses parameters $T_1$, $T_2$, and $T_3$ and requires the usage of a reference clock. Basically, two or more non-overlapping windows, each with a certain width at a fixed time away from a reference point, is generated based on these parameters. The decoding decision is based on the window having the highest number of pulses contained in that window. This method is useful in recovering data from pulses generated in response to noisy analog waveforms. Alternatively, a digital integration operation is performed in each window. The window with the highest count (energy) will be deemed to be the window that contains the desired information. Windows with lower counts (less energy) are presumably due to signal noise.

FIG. 8 is provided merely as an example to further illustrate this aspect of the invention. In this example, two binary symbols, 0 and 1, are to be recovered. Let binary symbol 0 be represented by a group of pulses comprising one pulse. Let binary symbol 1 be represented by a group of pulses comprising two pulses. In general, the $T_1$ parameter of a group of pulses depends on the next binary symbol. Thus, the $T_1$ parameter for a current group of pulses whose next group of pulses represents binary symbol 1 will be different from the $T_1$ parameter of a current group of pulses whose next group of pulses represents binary symbol 0. Consequently, the separation between a first group of pulses and a second group of pulses depends on the information symbol (in this case, binary symbol 0 or1) that the second group of pulses represents. The foregoing factors form the basis for decoding in accordance with this embodiment of the present invention.

Trace 81 in FIG. 8 shows a typical noisy analog waveform after passing through a noisy channel, such as would occur during transmission of the signal. Trace 82 illustrates typical groups of pulses generated in response to the analog waveforms 81. Passing them through a comparator reshapes the groups of pulses in 82. The result is shown in trace 83.

In the following illustrative example of this embodiment of the invention, a first group of pulses $B_1$ (consider for example, group 88) will establish a reference point relative to which plural non-overlapping windows will be launched. The windows will look for a third group of pulses $B_3$ (in this example, group 84). A second group of pulses $B_2$ (in this example, group 87) will establish a reference point relative to which plural windows will be launched to look for a fourth group of pulses $B_4$ (in this example, group 89). The third group of pulses $B_3$ will establish the reference point relative to which plural windows will be launched to look for a fifth group of pulses $B_5$, and so on. Detecting two or more groups of pulses beyond the reference point reduces the effect of noise in the detection process. It is also useful to enhance accuracy especially when a lower speed clock is used.

Recall that the group period $T_1$ varies depending on the following group of pulses. If the reference point is set relative to the first group of pulses, then the binary symbol combination corresponding to the second and third groups of pulses must be considered. For example, the location of the second group of pulses relative to the reference point will depend on whether the second group of pulses represents a 0 or a 1. Similarly, the location of the third group of pulses relative to the second group of pulses will depend on whether the third group of pulses represents a0 or a 1. Thus, for one binary symbols, four two-bit combinations are possible. The second and third groups of pulses together may represent: 00, 01, 10, or 11. The position of the third group relative to the reference point, therefore, can be one of four positions.

However, it will be known what binary symbol the second group of pulses maps to once the processing is underway.

Thus, consider that processing has proceeded to the point where the reference point has advanced to a group of pulses $B_n$ (e.g., $B_1$ shown in FIG. 8). In accordance with this embodiment of the invention, group of pulses $B_{n+2}$ (e.g., $B_3$ in FIG. 8) will be decoded; $B_{n+2}$ is two groups downstream of $B_n$. However, group of pulses $B_{n+}$ (e.g., $B_2$ in FIG. 8) will have been decoded by the time the reference point is set to group $B_n$, because when the reference point was set at group $B_{n-1}$ group $B_{n+1}$ would have been decoded. Thus, position of group $B_{n+2}$ can be determined by two pairs of windows, one pair of windows used for the case where group $B_{n+1}$ decodes to binary symbol 0 and another pair of windows for the case where group $B_{n+1}$ decodes to binary symbol 1.

As mentioned, once processing is underway group $B_{n+1}$ will always be known. However, the very first group of pulses necessarily must be decoded without reference to a previous group of pulses, since by definition there is no such group. This boundary condition can be accounted for in any of a number of ways; for example, sending a known sequence at the beginning of the transmission.

The foregoing processing is provided by circuit 1400 illustrated in FIG. 14. The signal 83 feeds into an edge detector 1402. The reference clock feeds into a group period measurement unit 1430 which measures the symbol group period. A symbol tracking unit 1432 is provided to ensure correct placement of the reference point. The symbol tracking unit issues a trigger signal to the edge detector 1402, to determine the next reference point. The symbol tracking unit and the edge detector effectively cooperate to signal a reference point at the rising edge of the first pulse in a group of pulses. This establishes a reference point 85 from which the appropriate pair of nonoverlapping windows will be launched. Generally, the reference point is chosen carefully by taking into account the parameters $T_1$, $T_2$, and $T_3$.

There are two decoding branches, identified as the "odd" branch and the "even" branch. The naming is arbitrary and the "odd" and "even" terminology is related to the "every other group" processing behavior of this embodiment of the invention. The so-called "odd" branch comprises odd group detector 1404, windows generator 1412, detection unit 1414, decoder 1434, and decision block 1401. Similarly, the "even" branch comprises even group detector 1406, windows generator 1416, detection unit 1418, decoder 1436, and decision block 1403.

The odd and even branches are cross-coupled via data lines 1435 and 1437. The data line 1435 feeds a decoded symbol to the windows generator 1416, and the data line 1437 feeds a decoded symbol to the windows generator 1416. Each windows generator can generate one of two pairs of detection windows, depending on the symbol received on its corresponding data line.

Assume, for explanation purposes, that edge detector 1402 has detected the beginning of the first pulse in the group of pulses 88, shown in FIG. 8. At this time, as discussed above, the group of pulses 87 will have already been decoded relative to the group of pulses just preceding group 88. Also for purposes of explanation, it can be assumed without loss of generality that the group of pulses 87 was decoded along the even branch, and so the binary symbol $B_2$ corresponding to the group of pulses 87 is known. The decoded binary symbol is delivered from the decoder 1436 via the data line 1437 to the windows generator 1412.

The windows generator 1412 is triggered by the edge detector 1402, indicating the beginning of a group of pulses. Then, depending on the binary symbol received over the data line 1437, the windows generator opens (launches) one pair out of two possible pairs of detection windows. For example, if the binary symbol $B_2$ is a '0', then windows $W_1$, $W_2$ would be generated, an launched relative to the reference point 85 at times. If the binary symbol $B_2$ is a '1', then two other detection windows, say for example, $W_3$ and $W_4$ (not shown) would be launched relative to the reference point 85 at times different from $T_{W1}$, $T_{W2}$, say for example, $T_{W3}$ and $T_{W4}$ (also not shown).

FIG. 8 shows that binary symbol $B_2$ is assumed to be '0', and so the pair of detection windows $W_1$, $W_2$ will be launched at times $T_{W1}$, $T_{W2}$. The windows are launched one at a time, though not necessarily. Thus, the signal from the edge detector 1402 feeds into window generator 1412, indicating the beginning of group 84. Thus, the windows generator launches the first of the two windows, say detection window $W_1$ at time $T_{W1}$ from the reference point 85, by signaling the detection unit 1414. The pulse count (amount of energy, etc.) during that window is determined (measured) by the detection unit. This information is fed to the decoder 1434. If this is the first detection window then the decision box 1401 signals the detection unit to continue processing. The windows generator signals the detection unit to detect for pulses in the signal 83 using the detection window $W_2$ at time $T_{W2}$. The pulse count (amount of energy, etc.) is fed to the decoder. The decoder is able to determine whether detection window pairs $W_1$, $W_2$ or $W_3$, $W_4$ were received. The decoder then maps to a binary symbol based on which of the two window measurements contained the most pulse counts or pulse energy.

The decision box then issues a "YES" signal to the windows generators 1412 and 1416. This disables processing in the odd branch and enables processing in the even branch. The decoder 1434 delivers the binary symbol decoded from group 84 to the windows generator 1416. The reference point is moved to group 87, and the process repeats.

Each decoder 1434 and 1436 receives every other symbol from the incoming signal 83. These streams feed into a combiner 1444 where the two streams are merged into a single bit stream as the output data stream. A signal 1450 is sent to the symbol tracking unit 1432 to determine the next reference point.

In one variation of the foregoing described illustrative embodiment of the invention, the detection windows can be launched simultaneously to make the pulse count measurements. This and other variations are readily realizable by one of ordinary skill expending a modicum of design effort.

The foregoing described illustrative embodiments of the invention are preferably provided on special purpose digital signal processing circuitry using either FPGAs (field programmable gate arrays) or ASICs (application specific integrated circuits), and the like. A circuit implemented in an FPGA is designed by specifying interconnection of macrocells which may be formed from the gates on the gate array. A design implemented in an FPGA does not need to be specially fabricated, but may be simply programmed into the FPGA at power up using a serial programmable read only memory (PROM) or using a control interface such as that specified by the joint test action group (JTAG). The circuitry in an ASIC, on the other hand, is a combination of interconnected macrocells. Each macrocell represents a circuit element which may include multiple electronic components (e.g. transistors, resistors, capacitors). Such implementations offer opportunity for higher levels of integration to realize increased performance such as speed of operation, allowing for high data rates.

The designs can be provided using discrete logic and components, though lower performance may result. However, some applications may not require high data speeds, preferring lower cost devices instead. The block diagrams of the foregoing figures represent functional blocks that can be used to guide a design engineer(s) in the construction of devices according to the present invention, independent of the implementation strategy.

Although specific embodiments of the invention have been described, various modifications, alterations, alternative constructions, and equivalents are also encompassed within the scope of the invention. The described invention is not restricted to operation within certain specific data processing environments, but is free to operate within a plurality of data processing environments. Although the present invention has been described in terms of specific embodiments, it should be apparent to those skilled in the art that the scope of the present invention is not limited to the described specific embodiments.

Further, while the present invention has been described using a particular combination of hardware and software, it should be recognized that other combinations of hardware and software are also within the scope of the present invention. The present invention may be implemented only in hardware or only in software or using combinations thereof, depending on performance goals and other criteria not relevant to the invention.

The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

What is claimed is:

1. A system for recovering data from a signal, said signal comprising a plurality of groups of pulses, the system comprising:

detection means for detecting one of said groups of pulses;

measurement means, coupled to said detection means, for measuring one or more parameters which characterize said one of said groups of pulses; and symbol means, coupled to said measurement means, for mapping said one or more of said parameters to an information symbol, said measurement means comprising:

first and second pipelines, each having an input and an output, each configured to produce measurements for two or more groups of pulses, said second pipeline further configured to provide a delay of one group;

a first delay unit coupled to said first pipeline output;

a second delay unit coupled to said second pipeline output; and a decision component having an input, said first and second delay units coupled to said input, said first and second delay units configured to provide a delay during processing of said two or more groups of pulses.

2. The system of claim 1 wherein said one or more parameters includes parameters selected from the group consisting of: a group period (T1), a pulse width (T2), a pulse separation (T3), a silent period (T4), and number of pulses (Np).

3. The system of claim 1 wherein said one or more parameters is based on a timing relationship between said groups of pulses.

4. The system of claim 1 wherein said symbol means for mapping produces said information symbol based on at least two of said parameters.

5. The system of claim 1 wherein said first and second delay units each is configured to provide a variable delay, said variable delay depending on a group period of a group of pulses.

* * * * *